United States Patent [19]
Willmott et al.

[11] 4,064,404
[45] Dec. 20, 1977

[54] ACCESSORY FOR A GARAGE DOOR OPENER

[75] Inventors: Colin Barns Willmott, Des Plaines; James D. Stifle, Lombard, both of Ill.

[73] Assignee: Chamberlain Manufacturing Corporation, Chicago, Ill.

[21] Appl. No.: 678,066

[22] Filed: Apr. 19, 1976

[51] Int. Cl.² .................................... H03K 17/26
[52] U.S. Cl. .................... 307/141.4; 307/252 B; 361/191
[58] Field of Search ................... 361/191, 205; 307/252 B, 311, 293, 141, 141.4, 141.8; 315/360

[56] References Cited

U.S. PATENT DOCUMENTS

| | | | |
|---|---|---|---|
| 3,743,861 | 7/1973 | Bolmgren | 307/252 B |
| 3,745,382 | 7/1973 | Hoge et al. | 307/252 B |
| 3,855,482 | 12/1974 | Wills | 307/252 B |
| 3,909,703 | 9/1975 | Braddock | 307/252 B |

*Primary Examiner*—Herman J. Hohauser
*Attorney, Agent, or Firm*—Hill, Gross, Simpson, Van Santen, Steadman, Chiara & Simpson

[57] ABSTRACT

An accessory for a garage door opener which includes a circuit which is energized when the garage door operator is actuated and which can be used to energize a power circuit as, for example, a lamp so as to provide illumination upon energization of the garage door operator. The lamp automatically turns off after a pre-set time and can also be manually controlled by an on-off switch.

6 Claims, 3 Drawing Figures

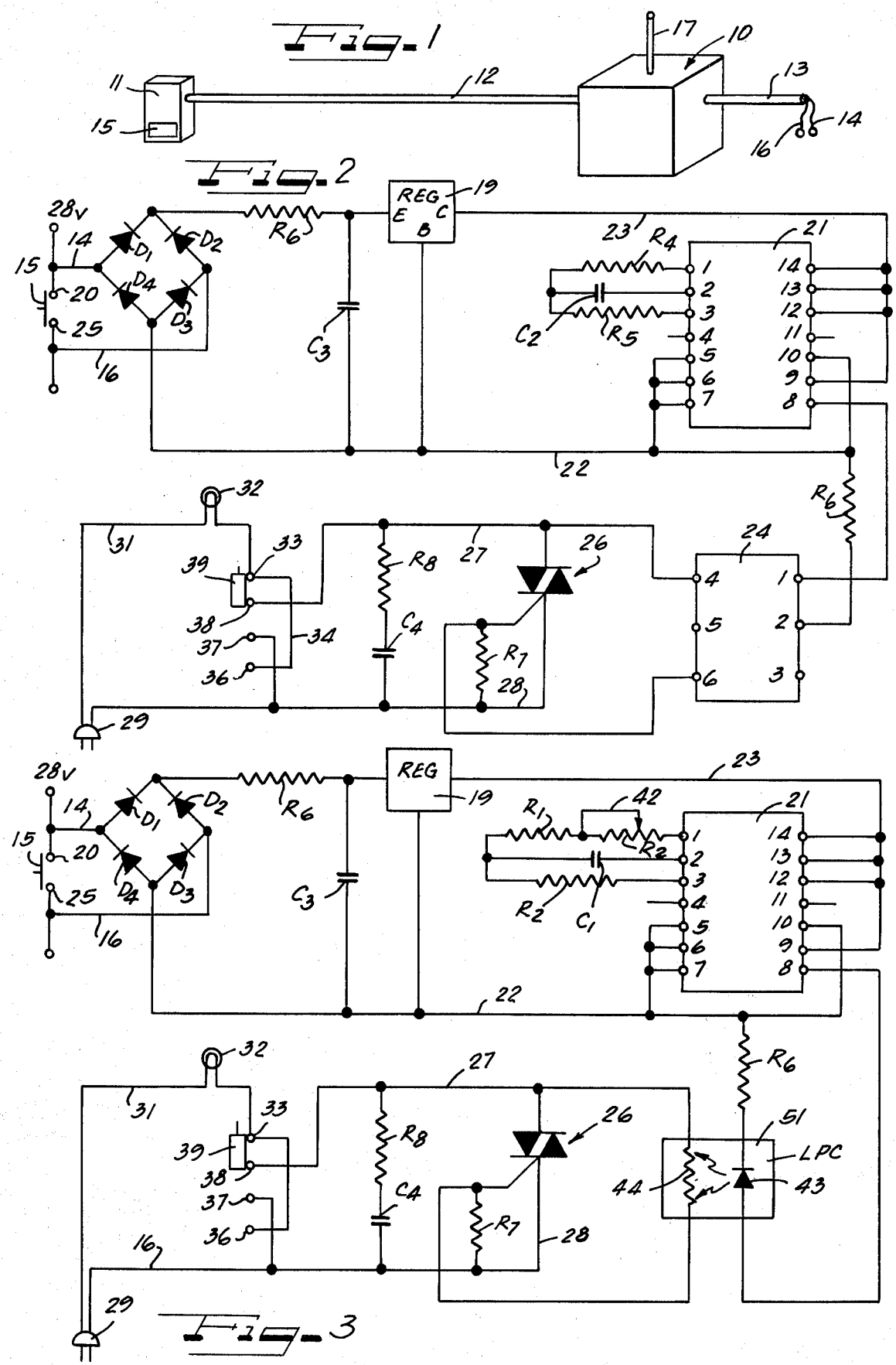

ACCESSORY FOR A GARAGE DOOR OPENER

BACKGROUND OF THE INVENTION

1. Field of the Invention:

This invention relates in general to a circuit for energizing a power circuit when a garage door operator is actuated.

2. Description of the Prior Art:

Radio control and manual switch control garage door actuators have come in to wide use due to their convenience and safety which allows a garage door to be opened or closed remotely by a radio transmitter or by a manual switch. Such units allow a driver of a vehicle to open a garage door in inclement weather without getting out of the car.

SUMMARY OF THE INVENTION

The present invention relates to an accessory for a garage door actuator which is interconnected to the low voltage circuit and the actuating switch of the garage door opener and which energizes a power circuit so as to turn on yard lamps or other devices when the garage door opener is energized. Such power circuit can remain energized for a predetermined time before being de-energized and, thus, when the garage door opener is actuated, yard lights or other power devices can be actuated.

Other objects, features and advantages of the invention will be readily apparent from the following description of certain preferred embodiments thereof taken in conjunction with the accompanying drawings although variations and modifications may be effected without departing from the spirit and scope of the novel concepts of the disclosure, and in which:

BRIEF DESCRIPTION OF THE DRAWINGS

FIG. 1 illustrates a garage door operator;

FIG. 2 illustrates the light accessory of the invention; and

FIG. 3 illustrates a modification of the invention.

DESCRIPTION OF THE PREFERRED EMBODIMENTS

FIG. 1 illustrates a garage door operator 10 which is connected to a power source through cable 17 and which is connected to a radio receiver 11 by cable 12 which has a push button switch 15. A cable 13 has a pair of leads 14 and 16 which connect to the light accessory of the invention as shown in FIGS. 2 and 3. FIG. 2 illustrates the leads 14 and 16 connected to opposite sides of the switch 15 which is movable to engage terminals 20 and 25 so as to actuate the garage door opener in a conventional manner. Leads 14 and 16 are connected to a rectifier comprising the diodes $D_1$, $D_2$, $D_3$ and $D_4$. The positive output is connected to one side of resistor R6 which has its other side connected to a 12 volt regulator 19. The negative side of the diode rectifier is connected to lead 22 which supplies an input to the regulator 19. A capacitor C3 is connected between lead 22 and the input to the regulator 19.

The output lead 23 of the regulator 19 and lead 22 are connected to a programmable timer 21 which can be a type MC-14541 CP which consists of a 16 stage binary counter, an integrated oscillator for use with an external capacitor and two resistors, an automatic power on reset circuit and output control logic.

In such unit, timing is initialized by turning on power, where upon the power on reset is enabled and initiates the counter. With the power already on an external reset pulse can be applied. Upon release of the initial reset command, the oscillator will oscillate with a frequency determined by the external RC network. The 16 stage counter divides the oscillator frequency with the $n^{th}$ stage frequency being $f_{osc}/2_n$th. These units with automatic reset initializes all counters when power turns on. External master reset is totally independent of automatic reset operation. Reset either automatic or master disables oscillator during resetting to provide no active power dissipation.

The oscillator/timer integrated circuit 21 has the following operating characteristics.

With auto reset pin set to a "0" the counter circuit is initialized by turning on power. Or with power already on, the counter circuit is reset when the master reset pin is set to a "1". Both types of reset will result in synchronously resetting all counter stages independent of counter stage. Auto reset pin when set to a "1" provides a low power operation.

The RC oscillator will oscillate with the frequency determined by the external RC network.

The resistor R4 is connected to pin 1 of the circuit 21 and has its other side connected to a capacitor C2 which has its other side connected to terminal 2 of circuit 21. Resistor R5 is connected from terminal 3 to the junction point of Resistor R4 and capacitor C2. Terminals 5, 6 and 7 are connected to lead 22. Terminals 9, 12, 13 and 14 are connected to lead 23.

Terminal 10 is connected to lead 22 and to one side of Resistor R3 which has its other side connected to terminal 2 of a driver 24 which may be a type MOC-3000. Terminal 1 of circuit 24 is connected to terminal 8 of circuit 21. Terminal 6 of circuit 24 is connected to the gate of a triac 26. One terminal of the triac is connected to lead 27 and the other is connected to lead 28. A resistor R7 is connected from the gate of the triac 26 to lead 28. A resistor R8 and a capacitor C4 are connected in series between leads 27 and 28. Lead 28 is connected to one side of a power supply by power plug 29 and is also connected to terminal 37 of switch 39. Lead 27 is connected to terminal 38 of switch 39. Switch contacts 36 and 33 are connected together by lead 34 and are connected to one side of a load which might, for example, be lamps 32. The other side of the load 32 is connected to the power plug 29. A movable contact 39 of the switch is movable to contacts 33 and 38 to connect lead 27 to power. Movable contact 39 can also be moved to engage contacts 37 and 38 to de-energize the circuit and prevent power being supplied to the load 32. The movable contact 39 can be moved further to engage contacts 36 and 37 so as to manually turn on load 32 by connecting it to power leads 28 and 31.

In operation, low voltage is applied to the diode bridge comprising the diodes $D_1$ through $D_4$ when the garage door operator is actuated by the closing of switch 15. This will cause lower voltage supply across leads 14 and 16 to drop to about 3 volts which will turn off the 12 volt regulator 19 thus resetting the oscillator timer integrated circuit 21. When the oscillator timer-integrated circuit 21 is reset, the output at pin 8 will go high plus 12 volts) turning on the triac driver 24 by supplying an output at terminal 6 to the gate of the triac 26. When the triac 26 is turned on with the switch 39 in the positioned shown engaging contacts 33 and 38 power can pass from lead 21 through the load 32 from contact 33 through movable switch 39 to contact 38 and through the triac 26 to lead 28 and to the other side of the power supply thus energizing the load 32.

At the same time that the oscillator timer-integrated circuit 21 is reset, its timing circuit is initiated and the timing circuit in the Motorola type MC-14541 CP is a 16 stage binary counter which obtains its input from its integrated oscillator that is controlled by the resistors R4 and R5 and the capacitor C2. When the counter has completed one count, the oscillator timer-integrated circuit 21 output at terminal 8 will go to zero volts and turn off the triac driver 24 which will turn off the triac 26 and power to the lamp 32. The resistors R4 and R5 and capacitor C2 can be adjustable to allow for an adjustment over a desired range as, for example, from approximately fifteen seconds to three minutes.

FIG. 3 is a modification of the invention wherein the triac driver 24 is replaced by a LED-Photoconductor isolator 51 which might be a type MOC-3001 or a type CLM 8500. These units include a light emitting diode 43 and a photoconductor detector 44. The light emitting diode 43 is connected between resistor R6 and pin 8 of circuit 21. The element 44 is connected between the gate of the triac 26 and lead 27.

In the embodiment of FIG. 3, the LED-Photoconductor isolator 51 is energized to turn on the triac 26 when the receiver or push button 15 is actuated because the output terminal 8 will go to high voltage turning on the LED-Photoconductor isolator 51 which turns on the triac 26 thus turning on the light 32. The isolator 51 will remain energized until the counter of circuit 21 has completed one count at which time the output on lead 8 will go to a low mode (0 volts) and turn off the isolator 51 which will turn off the triac and disconnect power from the load 32.

In the embodiment of FIG. 3 the resistor R4 has been replaced by resistors R1 and R2 in series and wherein the resistor R2 has a wiper contact 42 to allow the adjustment of the oscillator frequency in circuit 21 which will allow a short or long time period to be set for energization of the lamps 32, after operation of the receiver or closing of the push button 15.

It is seen that this invention provides a novel accessory power circuit for a garage door operator and although it has been described with respect to preferred embodiments it is not to be so limited as changes and modifications can be made which are within the full intended scope as defined by the appended claims.

We claim as our invention:

1. An accessory circuit for a garage door opener comprising:
    a high voltage power supply,
    a load,
    a triac switch connected in series with said load to said high voltage power supply,
    a gate signal circuit connected to the gate of said triac switch,
    a low voltage AC power supply,
    an actuating switch connected to said low voltage power supply,
    an oscillator-timer connected to said low voltage power supply and reset when said actuating switch is closed,
    an output of said oscillator-timer connected to said gate signal circuit,
    including a diode bridge rectifier connected between said low voltage power supply and said oscillator-timer,
    including a resistor and capacitor connected to said oscillator-timer circuit to control its timing cycle, and
    including a voltage regulator connected between said diode bridge rectifier and said oscillator-timer.

2. An accessory circuit according to claim 1 wherein said resistor is variable.

3. An accessory circuit according to claim 1 wherein said gate signal circuit comprises a light emitting diode and a light detector.

4. An accessory circuit according to claim 1 including a second resistor connected between said gate of said triac and one side of said high voltage power supply.

5. An accessory circuit according to claim 1 including a third resistor and a second capacitor connected across said triac.

6. An accessory circuit according to claim 1 including a three position switch connected to said load, said triac and said high voltage power supply and moveable to automatic position wherein said triac is in the high voltage power supply, to off position wherein said high voltage power supply is disconnected from said load and said triac, and to on position wherein said load is connected to said high voltage power supply.

* * * * *